United States Patent
Liu et al.

(10) Patent No.: US 8,263,877 B2
(45) Date of Patent: Sep. 11, 2012

(54) PRINTED CIRCUIT BOARD

(75) Inventors: Chien-Hung Liu, Taipei Hsien (TW);
Po-Chuan Hsieh, Taipei Hsien (TW);
Yu-Chang Pai, Taipei Hsien (TW);
Shou-Kuo Hsu, Taipei Hsien (TW)

(73) Assignee: Hon Hai Precision Industry Co., Ltd.,
Tu-Cheng, New Taipei (TW)

( * ) Notice: Subject to any disclaimer, the term of this patent is extended or adjusted under 35 U.S.C. 154(b) by 203 days.

(21) Appl. No.: 12/837,487

(22) Filed: Jul. 15, 2010

(65) Prior Publication Data
US 2012/0000700 A1    Jan. 5, 2012

(30) Foreign Application Priority Data
Jul. 1, 2010   (TW) .............................. 99121635 A

(51) Int. Cl.
*H05K 1/11*        (2006.01)
(52) U.S. Cl. ...................................... 174/261; 361/306.2

(58) Field of Classification Search .... 361/306.1–306.3, 361/307, 308.1, 313–315, 321; 174/250–266
See application file for complete search history.

(56) References Cited

U.S. PATENT DOCUMENTS

| | | | |
|---|---|---|---|
| 3,426,257 A * | 2/1969 | Youngquist | 361/328 |
| 6,094,335 A * | 7/2000 | Early | 361/303 |
| 2003/0038686 A1* | 2/2003 | Tripathi et al. | 333/12 |
| 2004/0136141 A1* | 7/2004 | Korony et al. | 361/306.3 |
| 2008/0158777 A1* | 7/2008 | Sohn et al. | 361/321.1 |

* cited by examiner

*Primary Examiner* — Yuriy Semenenko
(74) *Attorney, Agent, or Firm* — Altis Law Group, Inc.

(57) ABSTRACT

A printed circuit board includes a first signal layer, a second signal layer, and a dielectric layer sandwiched between the first signal layer and the second signal layer. The first signal layer includes two pads. The second signal layer includes two conducting pieces connected to two signal traces. The shape and material of the pads are the same as the shape and material of the conducting pieces. The projections of the pads on the second signal layer are overlapping with the conducting pieces.

1 Claim, 2 Drawing Sheets

PRINTED CIRCUIT BOARD

BACKGROUND

1. Technical Field

The present disclosure relates to a printed circuit board (PCB).

2. Description of Related Art

Some PCBs include connectors, which are connected to differential signal traces. Alternating current (AC) coupling capacitors need to be connected between the connectors and the differential signal traces. Referring to FIG. 1, a common PCB 100 includes a signal layer 110. The signal layer 110 includes two connector pads 12 used to connect a connector (not shown), and two capacitor pads 16 connected to two AC coupling capacitors 15. A pair of differential signal traces 14 are respectively connected to the two connector pads 12 through the two capacitor pads 16. However, the two capacitor pads 16 occupy space of the PCB 100 and the AC coupling capacitors 15 increase the cost of the PCB 100.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawing, is illustrated by way of example and not by way of limitation. It should be noted that references to "an" or "one" embodiment in this disclosure are not necessarily to the same embodiment, and such references mean at least one.

Figure 1:
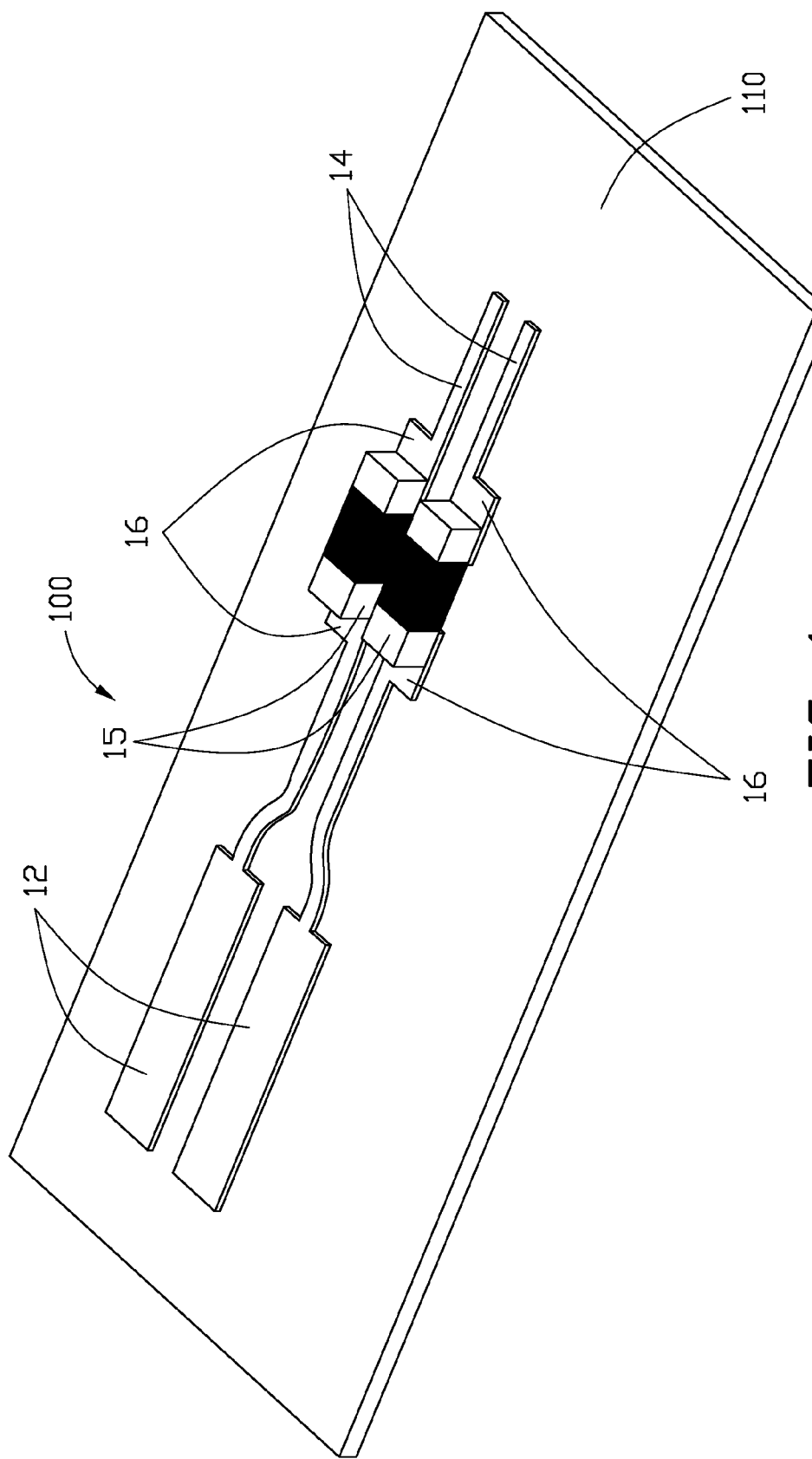
FIG. 1 is a schematic view of a common printed circuit board (PCB).
Figure 2:
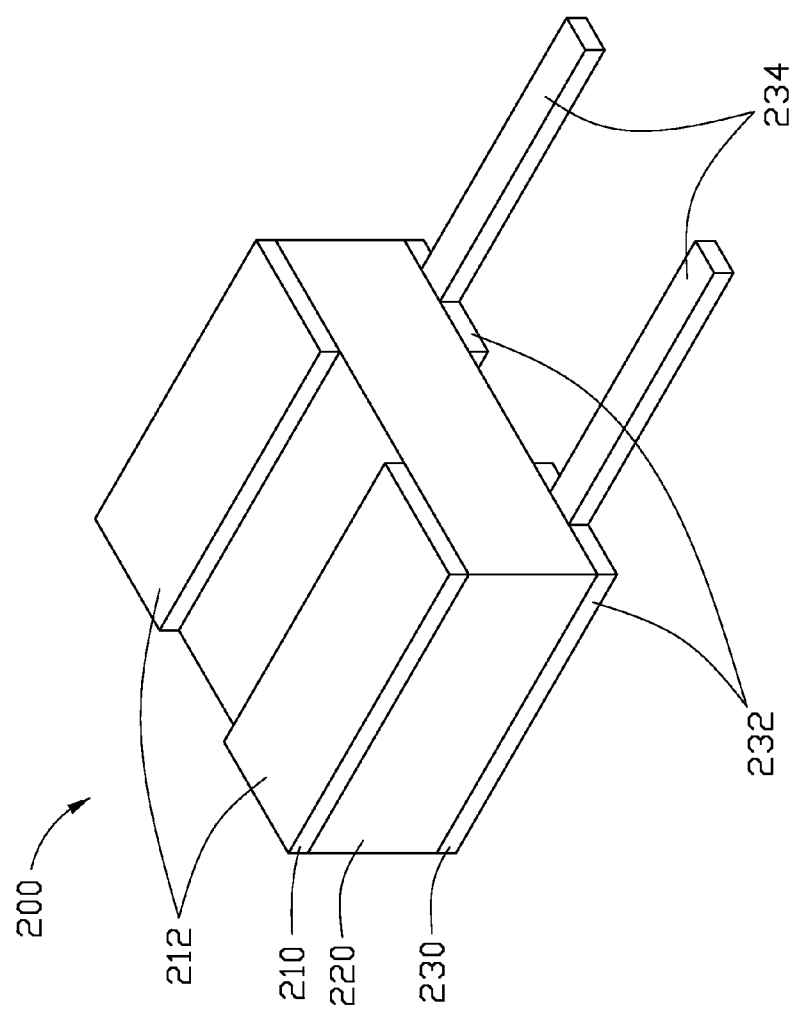
FIG. 2 is a partial, schematic view of an embodiment of a PCB.

Referring to FIG. 2, an embodiment of a printed circuit board (PCB) 200 includes a first signal layer 210, a second signal layer 230, and a dielectric layer 220 sandwiched between the first signal layer 210 and the second signal layer 230. The first signal layer 210 includes two connector pads 212 used to connect a connector (not shown). The second signal layer 230 includes two conducting pieces 232 whose shape and material are the same as the two connector pads 212. Furthermore, the projections of the two connector pads 212 on the second signal layer 230 are overlapping with the two conducting pieces 232. Therefore, the two connector pads 212 and the two conducting pieces 232 form two alternating current (AC) coupling capacitors. The material of the dielectric layer 220 between the two connector pads 212 and the two conducting pieces 232 can be changed to adjust the capacitance of the formed AC coupling capacitors by the two connector pads 212 and the two conducting pieces 232.

The conducting pieces 232 are connected to a pair of differential signal traces 234 in the second signal layer 230. When the connector is connected on the two connector pads 212, the connector communicates with the differential signal traces 234 through the formed AC coupling capacitors by the two connector pads 212 and the two conducting pieces 232. Therefore, the PCB 200 doesn't need to use any physical AC coupling capacitors, which can save space and reduce cost of the PCB 200.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A printed circuit board (PCB) comprising:
a first signal layer comprising at least one pad;
a second signal layer comprising at least one conducting piece connected to at least one signal trace, wherein the number of the at least one pad is equal to the number of the at least one conducting piece, the shape and material of the at least one pad are the same as the shape and material of the at least one conducting piece, the projection of the at least one pad on the second signal layer is overlapping with the at least one conducting piece; and
a dielectric layer sandwiched between the first signal layer and the second signal layer;
wherein the at least one pad comprises two connector pads, the at least one conducting piece comprises two conducting pieces, and the at least one signal trace comprises a pair of differential signal traces.

* * * * *